(12) United States Patent
Rivera et al.

(10) Patent No.: US 11,139,530 B2
(45) Date of Patent: Oct. 5, 2021

(54) SPACE SAVING, MODULAR, HOT-PLUGGABLE POWER MODULES

(71) Applicant: HEWLETT PACKARD ENTERPRISE DEVELOPMENT LP, Houston, TX (US)

(72) Inventors: Mark Rivera, Houston, TX (US); Hai Nguyen, Houston, TX (US); Daniel Humphrey, Houston, TX (US); Michael Miller, Houston, TX (US); David P Mohr, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 120 days.

(21) Appl. No.: 15/777,250

(22) PCT Filed: Jan. 29, 2016

(86) PCT No.: PCT/US2016/015835
§ 371 (c)(1),
(2) Date: May 18, 2018

(87) PCT Pub. No.: WO2017/131787
PCT Pub. Date: Aug. 3, 2017

(65) Prior Publication Data
US 2018/0337372 A1    Nov. 22, 2018

(51) Int. Cl.
*H01M 50/20*    (2021.01)
*H01M 50/256*    (2021.01)
(Continued)

(52) U.S. Cl.
CPC .......... *H01M 50/256* (2021.01); *G06F 1/188* (2013.01); *H01G 9/08* (2013.01); *H01G 11/78* (2013.01);
(Continued)

(58) Field of Classification Search
CPC ... G06F 13/385; H01M 50/204; H05K 7/1492
See application file for complete search history.

(56) References Cited

U.S. PATENT DOCUMENTS 7,304,453 B2    12/2007    Eaves
8,564,939 B2    10/2013    Shreve
(Continued)

OTHER PUBLICATIONS

International Search Report and Written Opinion, International Application No. PCT/US2016/015835, dated Oct. 21, 2016, pp. 1-12, KIPO.

(Continued)

*Primary Examiner* — Albert Wang
(74) *Attorney, Agent, or Firm* — Dicke, Billig & Czaja, PLLC

(57) ABSTRACT

An example power module includes an energy storage device, an energy storage carrier, and an electrical connector. The energy storage carrier houses the energy storage device and is removably insertable into a modular data storage slot of a computing device. The modular data storage slot has a data path and a first power path to removably couple to a data storage module. The electrical connector is to transfer energy from the energy storage device to a second power path associated with the modular data storage slot.

20 Claims, 7 Drawing Sheets

(51) Int. Cl.
*H01M 10/0525* (2010.01)
*G06F 1/18* (2006.01)
*H01M 10/42* (2006.01)
*H05K 7/14* (2006.01)
*H01M 50/502* (2021.01)
*H01G 9/08* (2006.01)
*H01G 11/78* (2013.01)
*G06F 1/30* (2006.01)

(52) U.S. Cl.
CPC ..... *H01M 10/0525* (2013.01); *H01M 10/425* (2013.01); *H01M 50/20* (2021.01); *H01M 50/502* (2021.01); *H05K 7/1492* (2013.01); *G06F 1/30* (2013.01); *H01M 2220/10* (2013.01)

(56) References Cited

U.S. PATENT DOCUMENTS

| | | |
|---|---|---|
| 9,059,447 B2 | 6/2015 | Scheucher |
| 2012/0098343 A1 | 4/2012 | Harris et al. |
| 2012/0250245 A1* | 10/2012 | Utz .................. G06F 1/1658 361/679.37 |
| 2013/0155599 A1 | 6/2013 | Ross et al. |
| 2013/0193764 A1 | 8/2013 | Bailey et al. |
| 2013/0307479 A1 | 11/2013 | Kim |
| 2013/0344359 A1 | 12/2013 | Ledbetter et al. |
| 2014/0108846 A1* | 4/2014 | Berke .................. G06F 1/263 713/340 |
| 2014/0342620 A1 | 11/2014 | Goesmann et al. |
| 2015/0137738 A1 | 5/2015 | Chien |
| 2016/0209901 A1* | 7/2016 | Wilcox .................. G06F 1/30 |
| 2016/0359210 A1* | 12/2016 | Hasegawa ........... H01M 10/613 |
| 2018/0205048 A1* | 7/2018 | Enomoto et al. |
| 2019/0109356 A1* | 4/2019 | Kaga |

OTHER PUBLICATIONS

R. Gitzendanner et al., "High Power and High Energy Lithium-ion Batteries for Under-water Applications," Journal of Power Sources, 2004, pp. 416-418, No. 136, Elsevier B.V.

* cited by examiner

SPACE SAVING, MODULAR, HOT-PLUGGABLE POWER MODULES

BACKGROUND

Uninterruptible Power Supplies (UPS) are often used in computer rooms and data centers to supply continuous operation for computer server systems. Typically a significant amount of physical space is allocated within a server rack, computer room, or within the data center for an UPS with appropriate capacity.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

For electrical devices, such as server systems, it can be desirable to have an uninterrupted power supply. Typically, an alternating current (AC) input power source from a public grid is made uninterruptible using an Uninterrupted Power Sources (UPS) (e.g., large batteries) as a back-up power supply. When service is interrupted, the UPS can discharge to power the servers. The UPS is often positioned at the rear of server racks housing the servers to supply back-up power to the servers in the case of interruption of a primary power source. The UPS can be bulky and occupy space that could be used to house other components. Additionally, batteries included in the UPS power supply back-up can be sensitive to heat. Due to cooling air flowing through the server systems from the front to the rear, the rear of server racks is typically hotter than the front of server racks.

In accordance with aspects of the present disclosure, a power module can be installed inside modular data storage slots of an electrical device such as a server, the modular data storage slots being otherwise suitable to house a hard drive. The power module can provide a secondary source of energy to the server in instances of loss of primary power, for example. By locating the power modules in the modular data storage slots at the front of the server, the power modules are exposed to cooler ambient air temperatures than otherwise would be exposed to. As described in greater detail below, examples of the power modules of the present disclosure can be inserted into a single or multiple, large or small form factor, modular data storage slots of a server or other computing device. For example, power modules can be sized to occupy two or more modular data storage slots when inserted into a server. The power module can be sized to supply the energy/power for the individual server that the power module is housed in and electrically connected to.

Figure 1A:
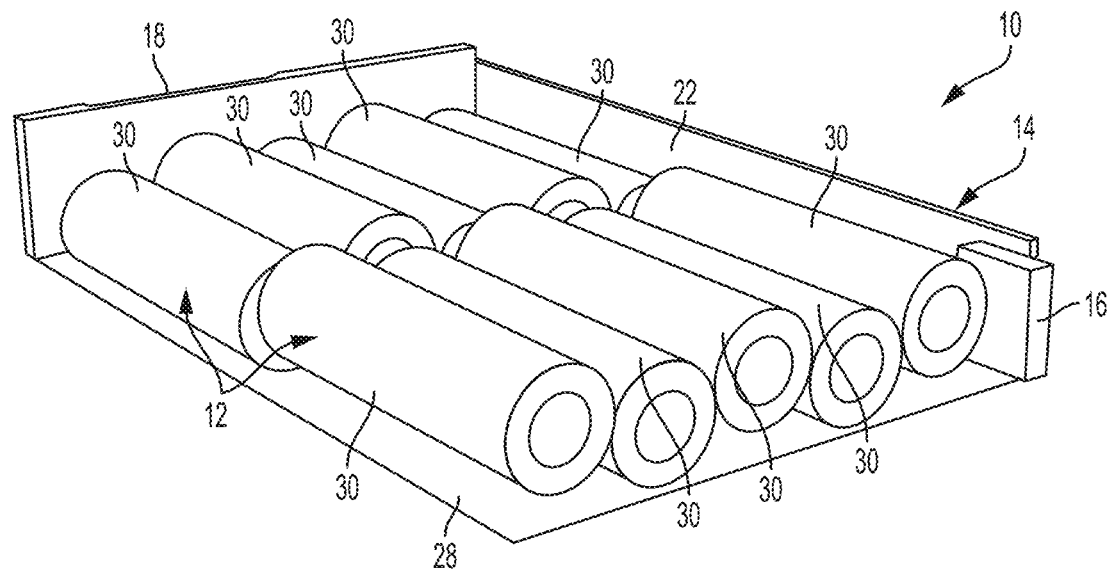
FIG. 1A is a back perspective view of an example power module in accordance with aspects of the present disclosure.
Figure 1B:
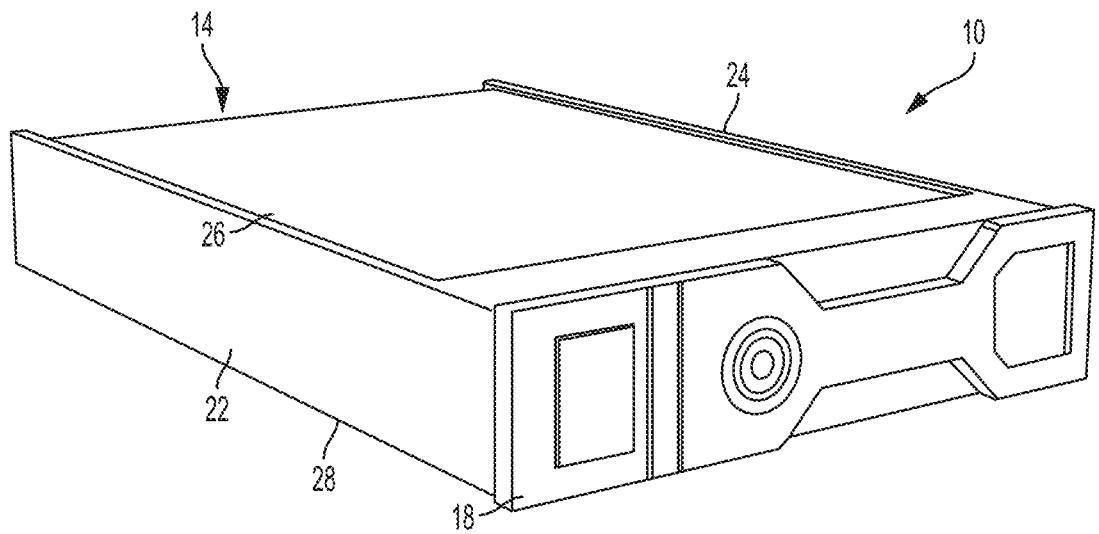
FIG. 1B is a front perspective view of the power module in accordance with the example illustrated in FIG. 1A.
Figure 5A:
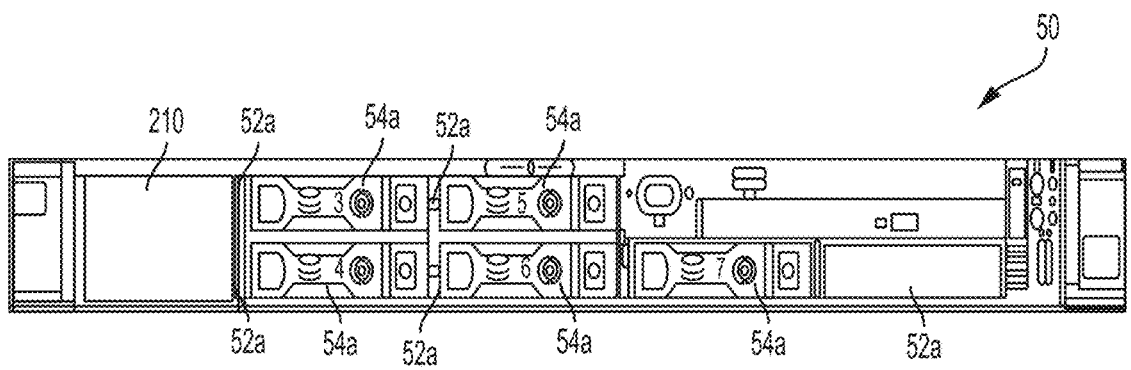
Figure 5B:
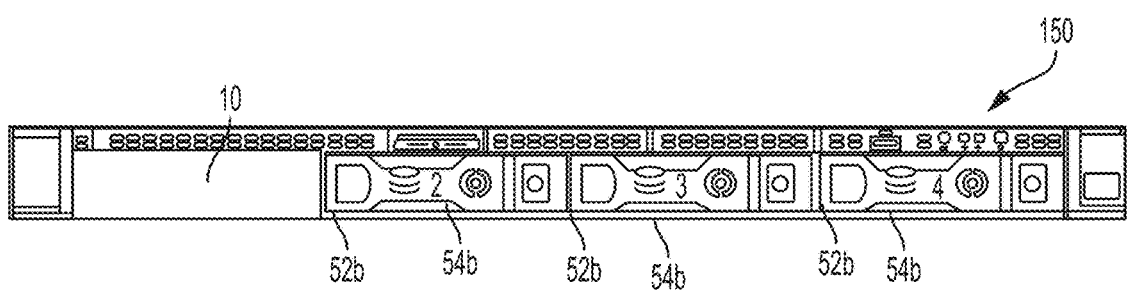

FIGS. 1A and 1B are perspective views of one example of a power module 10 in accordance with aspects of the present disclosure. Power module 10 includes an energy storage device 12, an energy storage carrier 14, and an electrical connector 16. Energy storage device 12 is housed within energy storage carrier 14. Energy storage carrier 14 can be generally rectangular, including a front 18, a back 20 opposite the front 18, opposing sides 22 and 24, a top 26, and a bottom 28 opposite the top 26. FIG. 1A is illustrated with only bottom 28, side 24, and front 18 of energy storage carrier 14 in order to illustrate energy storage device 12 and electrical connector 16 within an interior of energy storage carrier 14 more clearly. In the example illustrated in FIGS. 1A and 1B, energy storage carrier 14 is sized to fit into a modular data storage slot, or bay, of a large form factor server (see, e.g., FIG. 5B). Energy storage carrier 14 can be rigid and provides structural support to contain energy storage device 12 positioned within energy storage carrier 14 in a desired configuration. Once assembled, the interior of energy storage carrier 14, and energy storage device 12 housed within, can be fully enclosed by energy storage carrier 14. In some examples, energy storage carrier 14 is fixedly closed and energy storage device 12 housed within is inaccessible to the end user.

Energy storage device 12 can include multiple energy storage units 30. Electrical conductors, such as bus bars, for example(not shown), can be included inside carrier 14 to electrically connect energy storage units 30 forming energy storage device 12 to one another and to electrical connector 16. In some examples, energy storage units 30 are batteries. More particularly, in some examples, energy storage units 30 are lithium ion batteries (e.g., 18650 lithium ion cell batteries). Energy storage device 12 can also be modular multi-level converters, aluminum electrolytic capacitors, or ultra-capacitors, for example. In the example illustrated in FIGS. 1A and 1B, energy storage units 30 are sized and positioned to fit within carrier 14 sized to fit within a single large form factor modular data storage slot (see, e.g., FIG. 5B). In one example, energy storage units 30 are positioned in two rows of five each. Energy storage units 30 can be mechanically and electrically pre-assembled together to form energy storage device 12. For example, energy storage units 30 can be soldered together along with electrical conductors (e.g., bus bars) and then shrink wrapped in the desired configuration. Other suitable means of mechanically maintaining energy storage units 30 in the desired configuration and electrically connecting energy storage units 30 are also acceptable.

Electrical connector 16 electrically connects to energy storage device 12. In some examples, electrical conductors (e.g., bus bars) (not shown) electrically connects energy storage units 30 together and with electrical connector 16. Electrical connector 16 partially extends from back 20 of energy storage carrier 14 to electrically couple with a power connector (not shown) of a server. In some examples, electrical connector 16 is a low profile, high current connector. Electrical connector 16 can be positioned such that electrical connector 16 is offset from a hard drive connector (not shown) of the server when power module 10 is installed in the server. Electrical connector 16 can be configured to the highest level of energy used by the server. In one example, 12 volts can be transferred from the energy storage device 12 to the server. Control circuitry, as discussed further below, can be included to manage power from energy storage device 12 to the server. In some examples, power module 10 includes battery management system (BMS) control circuitry.

Figure 2A:
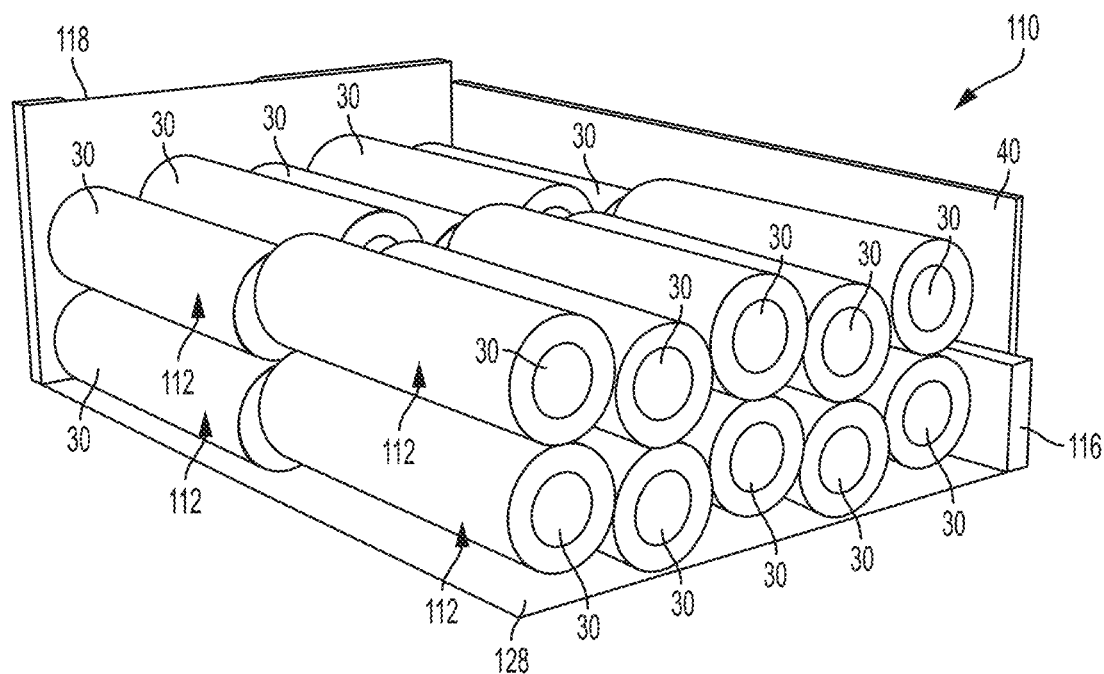
FIG. 2A is a back perspective view of an example power module in accordance with aspects of the present disclosure.
Figure 2B:
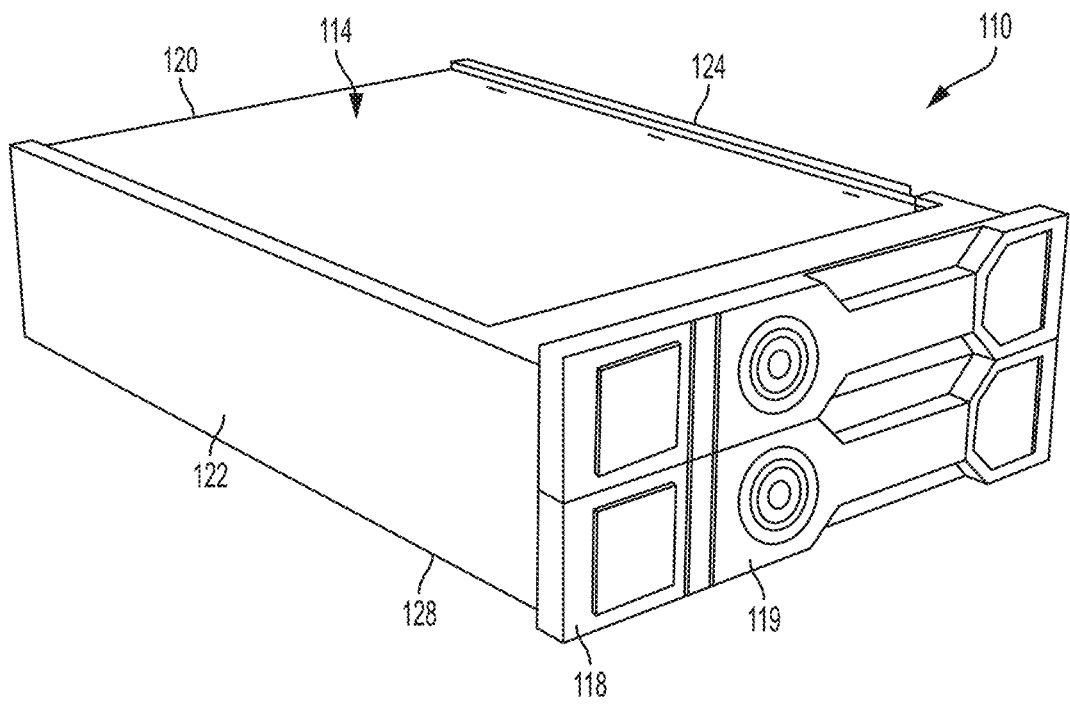
FIG. 2B is a front perspective view of the power module in accordance with the example illustrated in FIG. 2A.
Figure 5C:
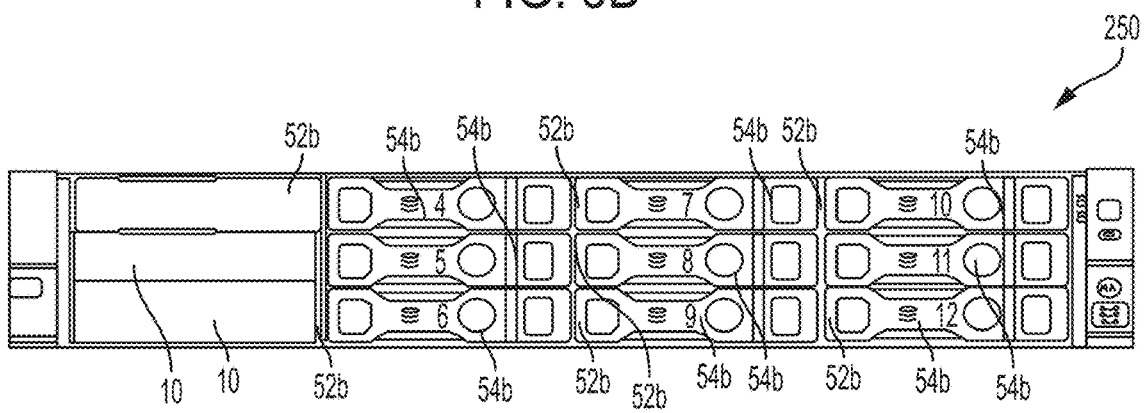

FIGS. 2A and 2B illustrate another example of a power module, power module 110, in accordance with aspects of the present disclosure. Aspects of power module 110 are similar to power module 10. Similar to power module 10, power module 110 includes an energy storage device 112, an energy storage carrier 114, and an electrical connector 116. Energy storage carrier 114 can be generally rectangular, including a front 118, a back 120 opposite the front 118, opposing sides 122 and 124, a top 126, and a bottom 128 opposite the top 126. Power module 110 can be accommodated in a pair of large form factor modular data storage slots, for example (see, e.g., FIG. 5C). Power module 110 can include a hot-plug front bezel 119 with a handle along front 118. Front bezel 119 of energy storage carrier 114 extends across front of two large form factor modular data storage slots. Energy storage units 30 can be positioned to extend with longitudinal centerlines parallel to the face of the front bezel. Energy storage device 112 can include multiple energy storage units 30 (e.g., batteries). In one example, energy storage units 30 are 18650 lithium ion cell batteries disposed within energy storage carrier 114. In one example, energy storage units 30 are oriented parallel to one another in rows with the longitudinal centerlines offset such that the row of energy storage units 30 (e.g., batteries) occupies a total width less than the sum of all of the diameters of energy storage unit 30. Energy storage units 30 can be electrically and mechanically interconnected to form energy storage device 112.

Electrical connector 116 electrically connects to energy storage device 112. In some examples, electrical conductors (not shown) electrically connects energy storage units 30 of energy storage devices 30 together and with electrical connector 116. A printed control panel (PCB) 40 can be included to control energy transfer from energy storage device 112 to the server when power module 110 is coupled to the server (see, e.g., FIG. 5C). Electrical connector 116 is electrically connected to PCB 40, and in some examples, electrical connector 116 can be located on PCB 40 to serve as a system power delivery path from energy storage device 112 to the server. In some examples, PCB 40 is a battery management system (BMS). PCB 40 can extend alongside and parallel to energy storage units 30. PCB 40 and electrical connector 116 can be positioned along an interior surface of side 124 of carrier 116.

Figure 3:
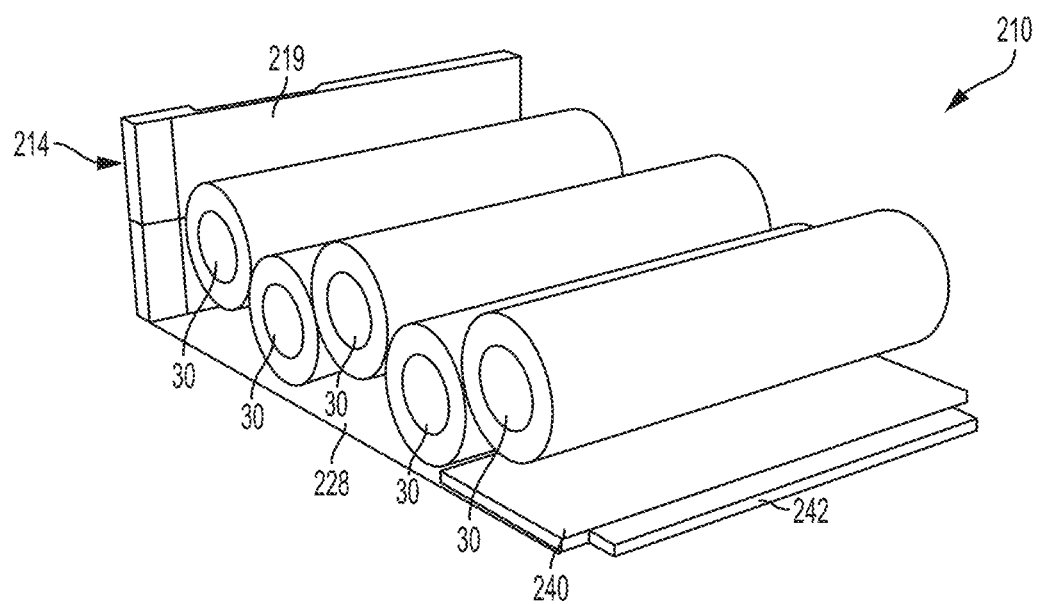
FIG. 3 is a back perspective view of an example power module in accordance with aspects of the present disclosure.
Figure 5D:
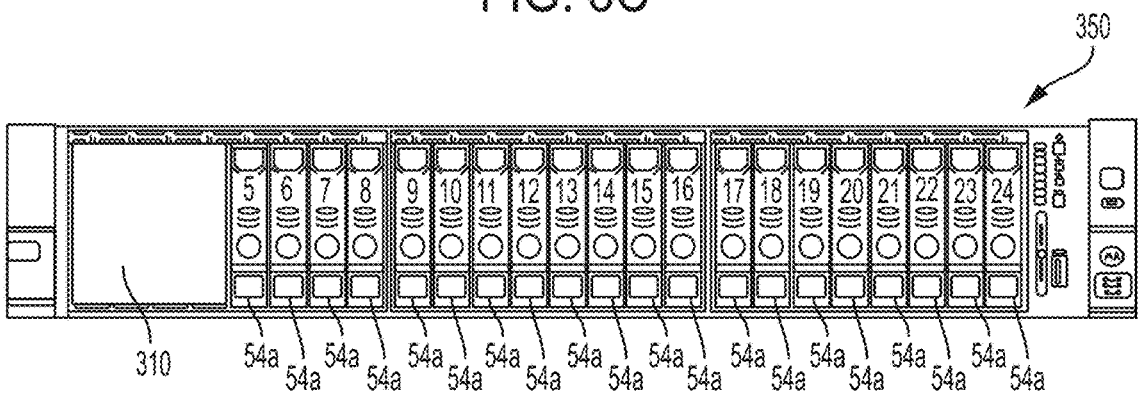

Another example power module 210, illustrated in FIG. 3, is configured to be inserted into a pair of adjacent small form factor modular data storage slots (see, e.g., FIG. 5D). Aspects of power module 210 are similar to power modules 10, 110 described above. Similar to power module 10, power module 210 includes an energy storage device 212, an energy storage carrier 214, and an electrical connector (not shown). Although only a front bezel 219 and a bottom 228 are illustrated in FIG. 3, it is understood that energy storage carrier 214 includes sides, etc. to define an interior space of energy storage carrier 214. The interior of energy storage carrier 214 is sized to fit within the space provided by two small form factor modular data storage slots, or bays. Energy storage device 212 can include multiple energy storage units 30 (e.g., batteries). Within the interior space provided by energy storage carrier 214, energy storage units 30 can be positioned to extend side-by-side, longitudinally aligned, or any other suitable manner. As illustrated in FIG. 3, a PCB 240 can extend parallel to bottom 228 of carrier 214 with a board edge 242 extending outside of energy storage carrier 214 for connection to a data path and/or a first power path corresponding to a modular data storage slot of an electronic device (not shown). The electrical connector is connectable to a second power path corresponding to the modular data storage slot.

Figure 4A:
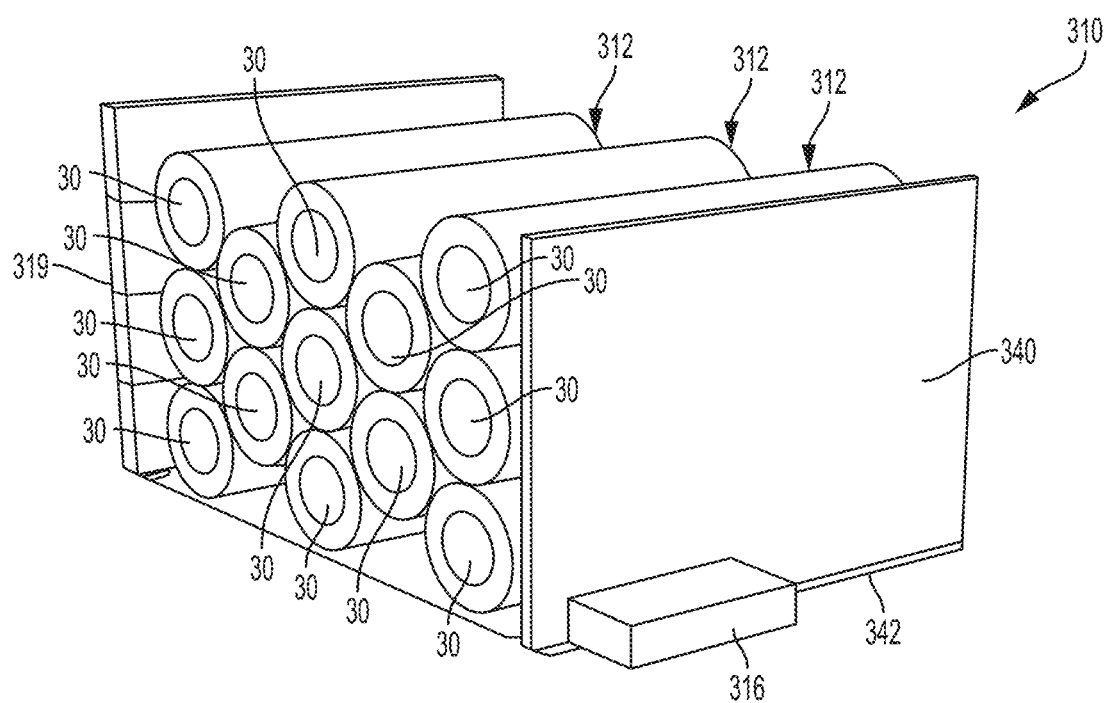
FIG. 4A is a back perspective view of an example power module in accordance with aspects of the present disclosure.
Figure 4B:
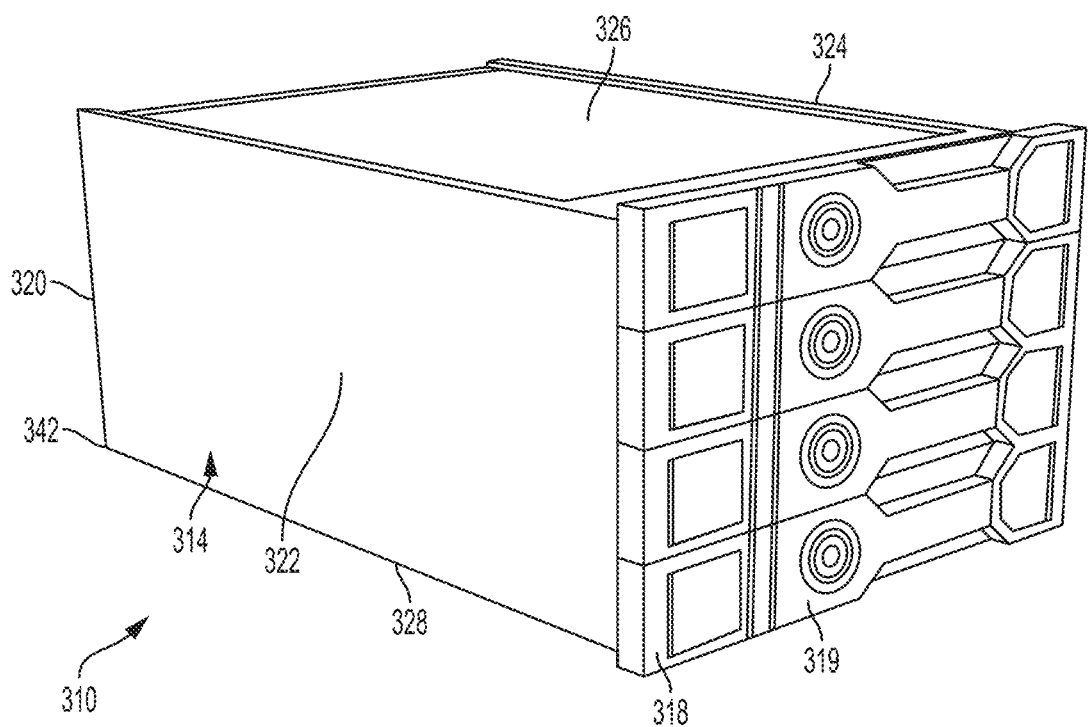
FIG. 4B is a front perspective view of the power module in accordance with the example illustrated in FIG. 4A FIGS. 5A-5D are example servers including power modules in accordance with aspects of the present disclosure.

FIGS. 4A and 4B illustrate another example of a power module 310 in accordance with aspects of the present disclosure. Power module 310 is suitable to be inserted into four small form factor modular data storage slots of a server. A front bezel 319 of the power module 310 extends across the front of four small form factor modular data storage slots when inserted into a server. In one example, alternating stacks of two and three energy storage units 30 (e.g., batteries) can be positioned in parallel and mechanically and electrically interconnected. A PCB 340 is included in power module 310 and can extend parallel or perpendicular to front bezel 319. PCB 340 includes a board edge 342 extending outside of energy storage carrier 314 for connection to a data path and/or a first power path corresponding to a modular data storage slot of an electronic device (not shown). Electrical connector 316 electrically coupled to PCB 340 and an energy storage device 312 and is connectable to a second power path corresponding to the modular data storage slot.

FIGS. 5A-5D illustrate example servers 50, 150, 250, 350 including power modules 10, 210, 310 of the present disclosure. Modular data storage slots 52a of servers 50, 350 are small form factor slots and modular data storage slots 52b are large form factor slots, for example. Modular data storage slots 52a, 52b can be house and connect with data storage modules 54a, 54b or power modules 10, 110, 210, 310, for example. Each of the plurality of modular data storage slots 52a, 52b includes a corresponding data path and a first power path (not shown) to removable couple with a data storage module 54a, 54b.

Servers 50, 150, 250, 350 can be operated at various voltage levels. In some cases, the highest voltage is 12 volts; the highest voltage can be regulated down to lower voltages as desired. Each server 50, 150, 250, 350 can receive power modules appropriately sized in energy storage and back-up power capacity. Power modules 10, 110, 210, 310 can provide the highest voltage level of the respective server 50, 150, 250, 350 installed in. Single or multiple power modules 10, 110, 210, 310 can be included in each server 50, 150, 250, 350. For example, server 350 illustrated in FIG. 5D includes multiple power modules 210. Power modules 10, 110, 210, 310 can be redundant, wherein the normally operating power module 10, 110, 210, 310 can support the energy load of an out of service power module 10, 110, 210, 310. Alternatively, power modules 10, 110, 210, 310 can be non-redundant, wherein the energy storage and power capacity can be increased by each additional power module 10, 110, 210, 310 included.

Power modules 10, 110, 210, 310 can be field replaceable or factory installed in servers 50, 150, 250, 350. The electrical connector of each power module 10, 110, 210, 310 is connectable to a second power path corresponding to the modular data storage slot (not shown). A PCB edge of power module 10, 110, 210, 310 can be suitable for connection to the data path and/or the first power path. The second power path has a greater power capacity than the first power path and can transfer all or majority of power from power modules 10, 110, 210, 310. The second power paths can be selectively included at one or multiple modular data storage slots 52a, 52b. Power modules 10, 110, 210, 310 can be accessible from a front of server 50, 150, 250, 350 and can be easily installed, removed, and/or replaced. Power module 10, 110, 210, 310 can be hot-plug, thus enabling power modules 10, 110, 210, 310 to be removable while server 50, 150, 250, 350 is operating and the operating system automatically recognizing the change, or non-hot-plug.

Figure 6:
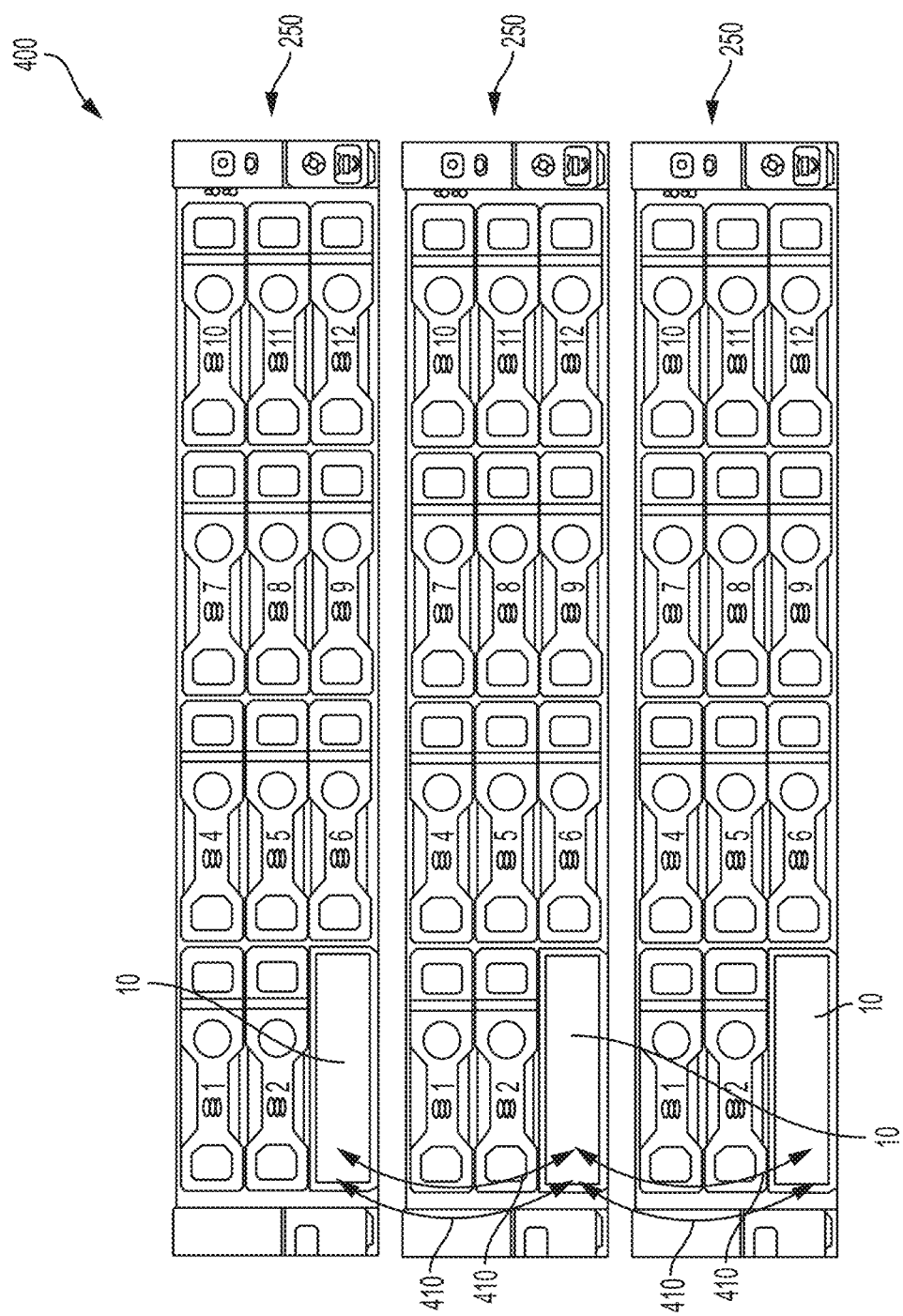
FIG. 6 is an example system of servers including interconnected power modules in accordance with aspects of the present disclosure.

FIG. 6 illustrates an example system 400 of servers 250 including interconnected power modules 10 in accordance with aspects of the present disclosure. System 400 includes external interconnections 410 coupling power modules 10 to one another. Interconnections 410 can provide electrical pathways between modules 10 in order to combine the individual modules 10 within a cluster of servers 250. Interconnections 410 can provide redundancy to servers 250 or increase the energy capacity available to an individual server 250 from modules 10.

Figure 7:
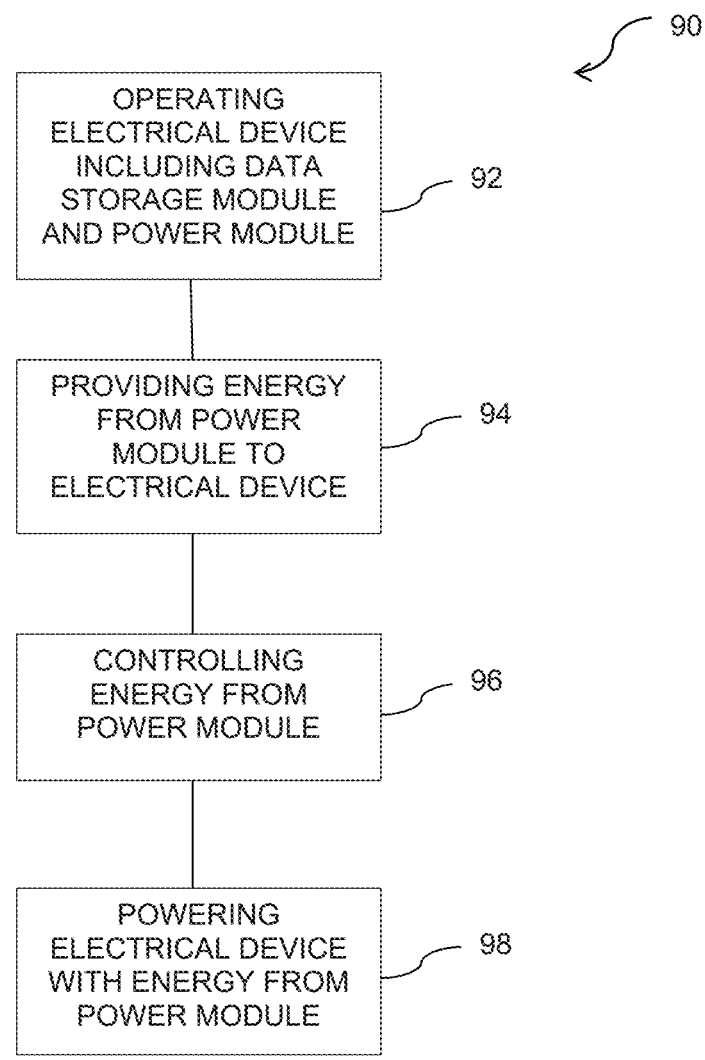
FIG. 7 is a flow chart illustrating an example method in accordance with aspects of the present disclosure.

FIG. 7 illustrates an example method 90 in accordance with aspect of the present disclosure. At 92, an electrical device including a plurality of modular storage slots is operated. At least one of the plurality of modular data storage slots housing a data storage module removably connected to a data path and a first power path and at least one of the plurality of modular data storage slots housing a power module removably connected to a second power path. At 94, energy is provided from the power module positioned in one of the plurality of modular data storage slots of the electrical device. At 96, energy from the power module to the electrical device is controlled. At 98, the data storage module is powered with energy from the power module. Controlling the energy from the power module to the electrical device can include controlling the energy with control circuitry of the power module. Controlling energy from the power module can be initiated in response to an interruption of an external power supply to the electrical device.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A power module, comprising:
an energy storage device, comprising:
a first plurality of interconnected energy storage units oriented in a first row to reduce a first overall width of the first plurality of interconnected energy storage units to be less than a first sum of widths, determined by diameters of each interconnected energy storage unit, of the first plurality of interconnected energy storage units forming the first row;
an energy storage carrier to house the energy storage device and removably insert into a modular data storage slot of a computing device, the modular data storage slot having a data path and a first power path to removably couple to a data storage module;
a printed circuit board (PCB) that extends parallel to a bottom of the energy storage carrier, the PCB having a board edge that extends outside of the energy storage carrier for connection to the data path and the first power path; and
an electrical connector to transfer energy from the energy storage device to a second power path associated with the modular data storage slot.

2. The power module of claim 1, wherein the second power path has a greater energy capacity than the first power path and the second power path is sized to supply energy sufficient to power the computing device upon loss of primary power.

3. The power module of claim 1, wherein the first plurality of interconnected energy storage units includes at least one lithium ion battery.

4. The power module of claim 1, wherein the first plurality of interconnected energy storage units includes a plurality of batteries electrically connected by electrical connectors.

5. The power module of claim 1, wherein the first plurality of interconnected energy storage units include at least one of a battery, an aluminum electrolytic capacitor, an ultra-capacitor, and a module multi-level converter.

6. The power module of claim 1, further comprising:
control circuitry to control energy transfer from the energy storage device to the computing device.

7. The power module of claim 1, wherein the energy storage carrier includes an electrical connector to electrically connect the energy storage device.

8. The power module of claim 1, further comprising:
a second plurality of interconnected energy storage units oriented in a second row; and
a third plurality of interconnected energy storage units oriented in a third row, wherein the third plurality of interconnected energy storage units are cylindrical and the third plurality of interconnected energy storage units are oriented parallel to one another in the third row with respective longitudinal centerlines offset to allow a second overall width of the third row to be less than a second sum of widths determined by diameters of each interconnected energy storage unit in the third row.

9. A server, comprising:
a plurality of modular data storage slots;
a data path and a first power path corresponding to each of the plurality of modular data storage slots to couple to a data storage module;
a second power path corresponding to a first modular data storage slot of the plurality of modular data storage slots to couple to a power module, the power module including a first plurality of interconnected energy storage units oriented in a first row to reduce a first overall width of the first plurality of interconnected energy storage units to be less than a first sum of widths, determined by diameters of each interconnected energy storage unit, of the first plurality of interconnected energy storage units forming the first row; and
a printed circuit board (PCB) that extends parallel to a bottom of the power module, the PCB having a board edge that extends outside of the power module for connection to the data path and the first power path.

10. The server of claim 9, wherein the power module includes a carrier and an energy storage device, the power module to be insertable into at least one of the plurality of modular data storage slots, the power module including an electrical connector connectable to the second power path to transfer energy from the power module to the server.

11. The server of claim 10, wherein the power module includes control circuitry to control the transfer of energy from the power module to the server.

12. The server of claim 10, wherein the power module is sized to occupy a single modular data storage slot.

13. The server of claim 10, wherein the power module is sized to occupy the first modular data storage slot concurrently with at least a second modular data storage slot of the plurality of modular storage slots.

14. The server of claim 9, wherein the power module further includes:
a second plurality of interconnected energy storage units oriented in a second row; and
a third plurality of interconnected energy storage units oriented in a third row, wherein the third plurality of interconnected energy storage units are cylindrical and the third plurality of interconnected energy storage units are oriented parallel to one another in the third row with respective longitudinal centerlines offset to allow a second overall width of the third row to be less than a second sum of widths determined by diameters of each interconnected energy storage unit in the third row.

15. The server of claim 9, wherein the plurality of interconnected energy storage units includes a plurality of batteries electrically connected by electrical connectors.

16. The server of claim 9, wherein the power module is a hot pluggable source of power sufficient to operate the server by supplying power via the second power path.

17. The server of claim 9, wherein the second power path has a greater energy capacity than the first power path and the second power path is sized to supply energy sufficient to power the server upon loss of primary power.

18. A method comprising:
operating an electrical device including a plurality of modular data storage slots, at least one of the plurality of modular data storage slots housing a data storage module removably connected to a data path and a first power path and, a first of the modular data storage slots from the plurality of modular data storage slots housing a power module removably connected to a second power path;
providing energy from the power module;
controlling the energy provided from the power module to the electrical device via the second power path; and
powering the data storage module with energy from the power module, the power module including a plurality of interconnected cylindrical energy storage units oriented in one or more rows to reduce an overall width of the plurality of interconnected energy storage units forming each individual row to be less than a sum of widths, determined by diameters of each interconnected energy storage unit forming a respective row, of the plurality of interconnected energy storage units forming the each individual row;
wherein powering the data storage module with energy from the power module comprises connecting the data storage module to the data path and the first power by a printed circuit board (PCB) that extends parallel to a bottom of the power module, the PCB having a board edge that extends outside of the power module for connecting the data storage module to the data path and the first power path.

19. The method of claim 18, wherein controlling the energy from the power module to the electrical device includes controlling the energy with control circuitry of the power module.

20. The method of claim 18, wherein controlling energy from the power module is initiated in response to an interruption of an external power supply to the electrical device.

* * * * *